(12) United States Patent
Vasquez et al.

(10) Patent No.: US 7,413,108 B2
(45) Date of Patent: Aug. 19, 2008

(54) WEDGE-BONDING OF WIRES IN ELECTRONIC DEVICE MANUFACTURE WITH REVERSIBLE WEDGE BONDING TOOL

(75) Inventors: Ramil N. Vasquez, Laguna (PH); Esteban L. Abadilla, Las Piñas (PH); Alexander M. Rogado, Cavite (PH); Crispulo Lictao, Jr., San Diego, CA (US)

(73) Assignee: NXP B.V., Eindhoven (NL)

( * ) Notice: Subject to any disclaimer, the term of this patent is extended or adjusted under 35 U.S.C. 154(b) by 541 days.

(21) Appl. No.: 10/525,594

(22) PCT Filed: Aug. 7, 2003

(86) PCT No.: PCT/IB03/03580

§ 371 (c)(1),
(2), (4) Date: Feb. 25, 2005

(87) PCT Pub. No.: WO2004/020137

PCT Pub. Date: Mar. 11, 2004

(65) Prior Publication Data

US 2005/0258215 A1    Nov. 24, 2005

(30) Foreign Application Priority Data

Aug. 28, 2002  (GB)  .................. 0219910.7
Nov. 6, 2002   (GB)  .................. 0225811.9

(51) Int. Cl.
  *B23K 37/00*  (2006.01)
  *B23K 31/00*  (2006.01)
  *B23K 31/02*  (2006.01)

(52) U.S. Cl. .................. 228/180.5; 228/4.5; 228/110.1; 228/1.1

(58) Field of Classification Search ............. 228/180.5, 228/4.5, 1.1, 110.1
See application file for complete search history.

(56) References Cited

U.S. PATENT DOCUMENTS

| 3,054,309 A |   | 9/1962  | Elmore et al. |
| 3,627,192 A | * | 12/1971 | Killingsworth .............. 228/54 |
| 3,813,006 A |   | 5/1974  | Holze, Jr. et al. |
| 5,364,004 A |   | 11/1994 | Davidson |
| 5,702,049 A |   | 12/1997 | Biggs et al. |

* cited by examiner

*Primary Examiner*—Jerry Lorengo
*Assistant Examiner*—Megha Mehta
(74) *Attorney, Agent, or Firm*—Peter Zawilski

(57) ABSTRACT

In the manufacture of electronic devices (22, 22'), e.g. discrete semiconductor power devices or ICs, a reversible bonding tool (10) is used having a bonding tip or wedge (1, 2) at each of its opposite ends (11, 12). After extensive use of the wedge-tip (1) at one end (11) for bonding wires (21), the tip (1) is worn somewhat. Instead of needing to replace the bond tool as in the prior art, the tool (10) in accordance with the invention is then reversed to use the wedge-tip (2) at the opposite end (12) for bonding further wires (20'). Thus, a cost saving is achieved with regard to tool material.

7 Claims, 2 Drawing Sheets

WEDGE-BONDING OF WIRES IN ELECTRONIC DEVICE MANUFACTURE WITH REVERSIBLE WEDGE BONDING TOOL

This invention relates to the wedge-bonding of wires in the manufacture of electronic devices. In particular, it relates to wedge-bonding methods, machines and tools, and also to electronic devices that include connections in the form of wires which are wedge-bonded using such methods or machines or tools.

The wedge-bonding of wires is a well-established technology that has been used for many decades to provide connections in electronic devices. By way of example, the following is a selection of recent United States patents on wedge bonding: U.S. Pat. No. 6,354,479, U.S. Pat. No. 6,135,341, U.S. Pat. No. 5,958,270, U.S. Pat. No. 5,950,903, U.S. Pat. No. 5,945,065, U.S. Pat. No. 5,906,706, U.S. Pat. No. 5,836,071, U.S. Pat. No. 5,702,049, U.S. Pat. No. 5,495,976, U.S. Pat. No. 5,452,838, U.S. Pat. No. 5,445,306, U.S. Pat. No. 5,364,004, U.S. Pat. No. 5,217,154, U.S. Pat. No. 5,148,959, U.S. Pat. No. 5,018,658, and U.S. Pat. No. 5,007,576. The whole contents of these U.S. patents are hereby incorporated herein as reference material. The bonding tool (typically of tungsten carbide) generally comprises a shank having the wedge-bonding tip at one end.

There is always a desire for cost reduction. One of the many items that involves an on-going cost is the need to periodically replace the bond tool when its bonding tip is becoming worn through use.

It is an aim of the present invention to reduce the cost of replacing the bond tool.

According to one aspect of the invention, there is provided a reversible bonding tool having a wedge-bonding tip at opposite ends of the tool. Thus, the present invention provides a dual-tip reversible tool, that increases the use time before replacement of the tool is required. Thus, a saving can be achieved in tool material.

According to another aspect of the invention, there are provided wire-bonding machines having such a reversible bonding tool in accordance with the present invention.

According to a further aspect of the invention, there are provided wedge-bonding methods, wherein:

a reversible bonding tool in accordance with the present invention is used, and, after using the tip at one end for bonding wires, the tool is reversed to use the wedge-bonding tip at the opposite end for bonding further wires.

According to yet another aspect of the invention, there are provided electronic devices, for example an integrated circuit or a power semiconductor device, that include connections in the form of wires which are wedge-bonded using such a method or machine or tool in accordance with the present invention.

Various advantageous features and feature-combinations in accordance with the present invention are set out in the appended Claims. These and others are illustrated in embodiments of the invention that are now described, by way of example, with reference to the accompanying diagrammatic drawings, in which:

Figure 1A:
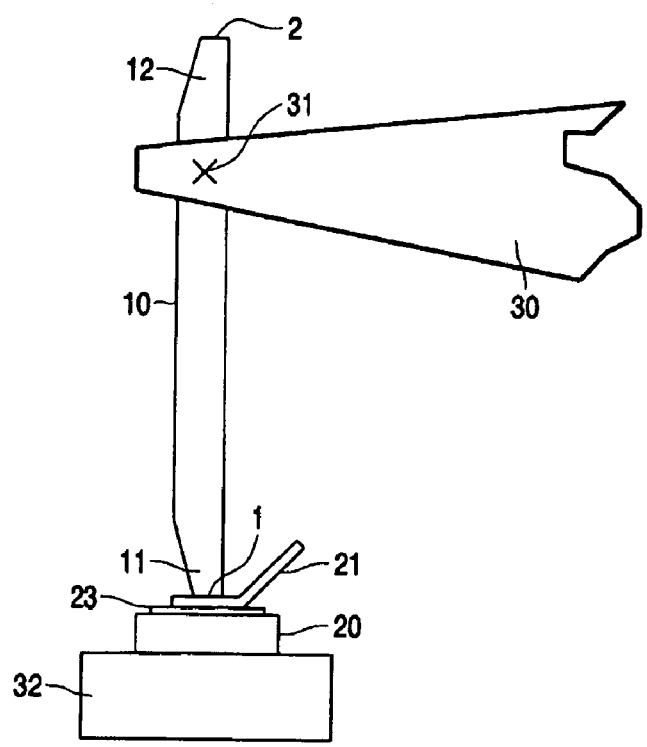
FIGS. 1A and 1B are a schematic side-view of part of an ultrasonic wedge-bonding machine in an embodiment of the present invention, during use at successive times in the manufacture of electronic devices.

It should be noted that all the Figures are diagrammatic. Relative dimensions and proportions of parts of these Figures have been shown exaggerated or reduced in size, for the sake of clarity and convenience in the drawings. The same reference signs are generally used to refer to corresponding or similar features in modified and different embodiments.

Figure 1B:
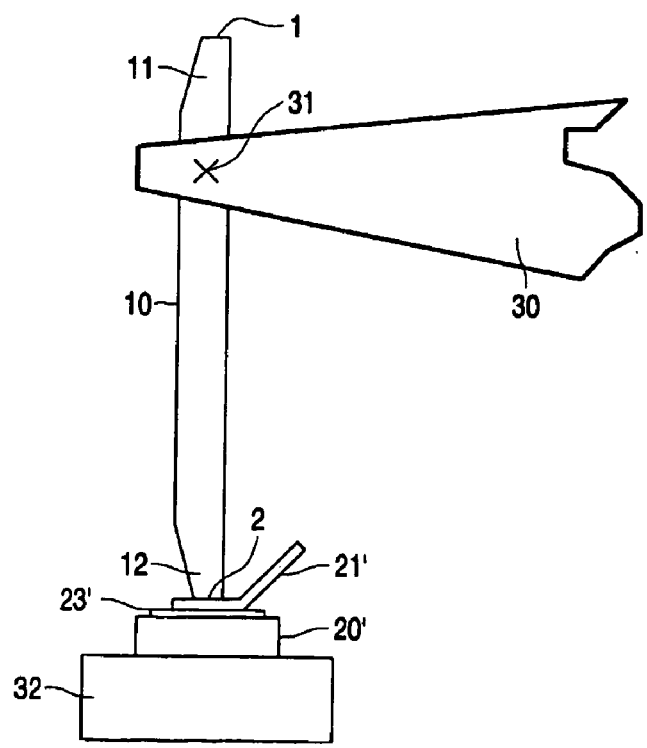
Figures 2A, 2B:
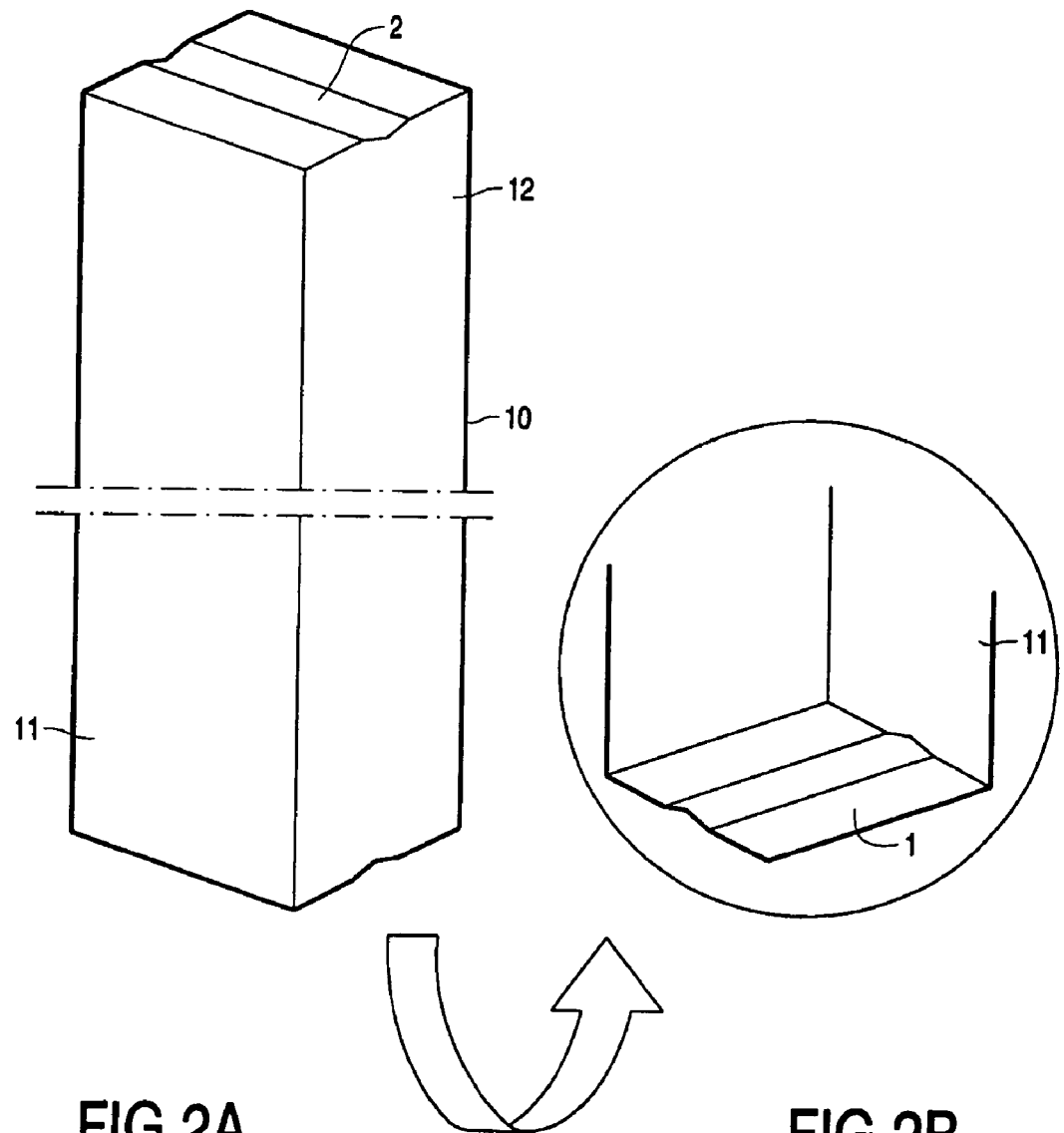
FIG. 2A is a downward-looking perspective view of the reversible bonding tool of FIG. 1, particularly of its working ends, and showing a bonding tip at its upper end in accordance with the invention.
FIG. 2B is a upward-looking perspective view of the lower working end of the bonding tool of FIG. 2, showing the bonding tip at this lower end.

FIGS. 1A and 1B illustrate a wire-bonding stage in the manufacture of electronic devices 20, 20', for example discrete semiconductor power devices or semiconductor integrated circuits (ICs). A reversible dual-tip bonding tool 10 is used having a bonding tip (also termed "wedge") 1, 2 at each of the opposite ends 11, 12 of the tool, see FIGS. 2A and 2B.

After extensive use of the wedge-bonding tip 1 at one end 11 for bonding wires 21 (as illustrated in FIG. 1A), the tip 1 is worn somewhat. Instead of needing to replace the bond tool as in the prior art, the tool 10 in accordance with the present invention is then reversed to use the wedge-bonding tip 2 at the opposite end 12 for bonding further wires 21' (as illustrated in FIG. 1B). Thus, a cost saving is achieved with regard to tool material.

Apart from using the reversible tool 10 in accordance with the present invention, the wedge-bonding process and the wire-bonding machine may be of known forms and so will not be described in detail.

Thus, FIGS. 1A and 1B illustrate the work area of the machine, where the device 20, 20' is placed on a work mount 32. Wire 21, 21' is fed continually into this work area from a spool (not shown). The wire 21, 21' is fed to a bond pad 23, 23' of the device 20, 20', and it is pressed against the bond pad 23, 23' by the lower working end (11 in FIG. 1A; 12 in FIG. 1B) of the tool 10. The wire 21, 21' may comprise aluminium (typically an Al alloy) for both discrete power devices and for ICs, and the bond pad 23, 23' may also comprise aluminium. In some devices, it may be preferred to use gold wire 21, 21'. The wire 21, 21' forms electrical connections between, for example, the bond pad 23, 23' and terminal leads of the device package (not shown).

While being pressed against the bond pad 23, 23', the wire 21, 21' is bonded to the pad 23, 23' by turning on an ultrasonic source to a transducer 30 that applies ultrasonic energy to the wire 21, 21' on the pad 23, 23' via the respective bonding tip 1 or 2 of the tool 10. FIGS. 1A and 1B schematically show the tool 10 mounted in a horn of the transducer 30. The horn can be of known form coupled to the source (not shown) of the ultrasonic energy.

In the embodiment illustrated in FIGS. 1A and 1B, the bond tool 10 comprises a shank, with tapered work ends 11 and 12 at the opposite ends of the shank. Narrow bonding tips 1 and 2 (which engage with the wire 21, 21' to be bonded) are present at these work ends, specific embodiments being shown in FIGS. 2A and 2B. In the interests of simplicity of drawing, the taper is not shown in FIGS. 2A and 2B.

There are a variety of known geometries and structures that may be adopted for the work end and wedge tip. FIGS. 1A, 1B, 2A and 2B illustrate a very simple grooved structure for the tips 1, 2 at the opposite working ends 11, 12, formed integral with the shank. In this case, the entire bonding tool 10 (its shank, its ends and its tips) may be of tungsten carbide. The single groove illustrated for each tip 1 and 2 in FIGS. 2A and 2B serves for retaining the wire in position against the bond pad during the ultrasonic bonding. In more complex tip designs, cross-grooves and/or protrusions may also be included.

FIGS. 1A and 1B do not show any detail of the wire-bonding machine in respect of the mounting of the tool 10 in the transducer horn 30. This mount 31 couples the tool 10 ultrasonically to the transducer in known manner. However, the form of the mount 31 and the tool shank are such as to allow the tool 10 to be reversed in the mount 31, so as to permit wire bonding using either the wedge-bonding tip 1 at one end 11 (FIG. 1A) or the wedge-bonding tip 2 at the opposite end 12 (FIG. 1B).

This reversible mount aspect is most readily achievable when the mount 31 engages the shank of the tool 10 at a position in between its opposite ends 11, 12. In the embodiment illustrated in FIGS. 1A and 1B, there is a different mount position on the tool shank when the respective ends 11 and 12 are used, but the shank is of the same (i.e. uniform) cross-section along at least the length(s) where these mount positions are present.

The drawings have shown only a very simple basic form for the tool and a schematic representation of the machine and of the bonding process. It will be apparent to persons skilled in the art that this basic form can be extended, embellished and modified with the type of features that are commonly used or sometimes used in the art.

Thus, for example, FIG. 1 does not show how the wire 21, 21' may be guided and fed to the device bond pad 23, 23'. A guide that is external to the bond tool 10 may be used close to the working tip 1, 2 when the tool 10 has the very simple structure illustrated in FIGS. 1 and 2. In other embodiments, a guide hole for the wire may be present in the bond tool 10. Thus, for example, separate guide holes (providing a through passage for the wire 21, 21') may extend obliquely through each end 11, 12 of the tool 10, or there may be a single feed hole (in the form of a capillary bore) that extends through the length of the tool 10.

In the embodiment described above, the whole bond tool 10 is composed of tungsten carbide. However, other embodiments may use other materials, for example, using hardened steel for the shank or titanium carbide for the shank.

Different known materials may be used for different parts of the tool 10 (the shank, the work ends 11 and 12, and the bonding tips 1 and 2), both bulk materials and coatings. The shank itself may be formed of a relatively hard, stiff material having a high modulus of elasticity (such as tungsten carbide, hardened steel, or titanium carbide), whereas other materials that are hard, precision-shaped and more abrasion resistant may be used at its opposite ends 11 and 12. Thus, for example, the bonding tips 1 and 2 themselves may comprise a ceramic material or another, more expensive material such as diamond or osmium.

From reading the present disclosure, many other variations and modifications will be apparent to persons skilled in the art. Such variations and modifications may involve equivalent and other features which are already known in the design, manufacture and use of wedge-bonding tools and machines and of electronic devices having wedge-bonded wires, and which may be used instead of or in addition to features already described herein. Examples of such features are to be found in the US patents cited herein previously as reference material.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to such features and/or combinations of such features during the prosecution of the present Application or of any further Application derived therefrom.

The invention claimed is:

1. A method of wedge-bonding wires in the manufacture of electronic devices, wherein:
    a reversible bonding tool is used having a mount that engages an elongated shank in a first position between opposite ends of the shank, each end including a wedge-bonding tip,
    and, after using the wedge-bonding tip at one end for bonding wires, the shank is reversed and engaged by the mount in second position between opposite ends of the shank to use the wedge-bonding tip at the opposite end for bonding further wires.

2. A method according to claim 1, wherein the shank is made of tungsten carbide.

3. A method according to claim 1, wherein the wires comprise aluminum or gold and are ultra-sonically bonded using a transducer coupled to the tool.

4. A method according to claim 1, wherein the shank has the same cross-section at the first and second positions.

5. A method according to claim 1, wherein the shank includes one or more guide holes for feeding the wires to the wedge-bonding tips.

6. A method according to claim 5, wherein the one or more guide holes includes separate guide holes extending obliquely through each end of the shank.

7. A method according to claim 5, wherein the one or more guide holes includes a capillary bore that extends from end to end through the length of the shank.

* * * * *